(12) United States Patent
Mizuno

(10) Patent No.: US 8,093,919 B2
(45) Date of Patent: *Jan. 10, 2012

(54) TEST CIRCUIT, METHOD, AND SEMICONDUCTOR DEVICE

(75) Inventor: Masayuki Mizuno, Tokyo (JP)

(73) Assignee: NEC Corporation, Tokyo (JP)

( * ) Notice: Subject to any disclaimer, the term of this patent is extended or adjusted under 35 U.S.C. 154(b) by 285 days.

This patent is subject to a terminal disclaimer.

(21) Appl. No.: 12/514,364

(22) PCT Filed: Nov. 6, 2007

(86) PCT No.: PCT/JP2007/071556
§ 371 (c)(1),
(2), (4) Date: May 11, 2009

(87) PCT Pub. No.: WO2008/056666
PCT Pub. Date: May 15, 2008

(65) Prior Publication Data
US 2010/0045332 A1 Feb. 25, 2010

(30) Foreign Application Priority Data
Nov. 10, 2006 (JP) .................. 2006-305076

(51) Int. Cl.
*G01R 31/02* (2006.01)
(52) U.S. Cl. .............................. 324/762.01; 324/762.06
(58) Field of Classification Search ............ 324/762.01–762.06; 714/726, 729, 731, 736
See application file for complete search history.

(56) References Cited

U.S. PATENT DOCUMENTS
4,875,003 A * 10/1989 Burke ........................... 714/736
(Continued)

FOREIGN PATENT DOCUMENTS
JP 1990248877 A 10/1990
(Continued)

OTHER PUBLICATIONS
International Search Report for PCT/JP2007/071556 mailed Jan. 29, 2008.

Primary Examiner — Huy Q Phan
Assistant Examiner — Joshua Benitez

(57) ABSTRACT

It is possible to provide a circuit and method for carrying out a parallel test using BOST (Built Out Self Test). The circuit includes first transfer circuits (11-1, 11-2, ...) that extract a data pattern supplied to a complete operating article chip (10) in a BOST (3) from the BOST and that successively transmit the data pattern in response to a clock signal, and second transfer circuits (12-1, 12-2, ...) that extract output data from the complete operating article chip (10) as an expectation value pattern and that successively transmit the expectation value pattern in response to the clock signal. The data pattern supplied to the complete operating article chip (10) is applied to one chip to be measured (10-1) and the data pattern from a corresponding stage of the first transfer circuits (11-1, 11-2, ...) is applied to each of other chips to be measured (10-2, ...). A comparator (14-1) compares output data from the one chip to be measured (10-1) to the output data from the complete operating article chip (10) to decide whether or not they coincide. Corresponding to the other chips to be measured (10-2, ... ), a comparator (14-2, ... ) compares respective output data from the other chips to be measured to the expectation value pattern from the corresponding stage of the second transfer circuits (12-1, 12-2, ...) to decide whether or not they coincide.

6 Claims, 4 Drawing Sheets

| U.S. PATENT DOCUMENTS | | | | |
|---|---|---|---|---|
| 6,242,269 B1 * | 6/2001 | Whetsel | ............................ | 438/11 |
| 6,456,102 B1 * | 9/2002 | Mori et al. | ................ | 324/750.01 |
| 6,646,460 B2 * | 11/2003 | Whetsel | .................... | 324/762.02 |
| 6,653,855 B2 * | 11/2003 | Mori et al. | ................ | 324/756.07 |
| 6,717,429 B2 * | 4/2004 | Whetsel | ...................... | 324/750.3 |
| 6,754,849 B2 * | 6/2004 | Tamura | ............................ | 714/30 |
| 6,894,308 B2 * | 5/2005 | Whetsel et al. | .................. | 257/48 |

| FOREIGN PATENT DOCUMENTS | | | |
|---|---|---|---|
| JP | 1992355383 | A | 12/1992 |
| JP | 1998111339 | A | 4/1998 |
| JP | 2002538464 | A | 11/2002 |
| JP | 2003016799 | A | 1/2003 |
| JP | 2004257898 | A | 9/2004 |

* cited by examiner

TEST CIRCUIT, METHOD, AND SEMICONDUCTOR DEVICE

REFERENCE TO RELATED APPLICATION

This application is the National Phase of PCT/JP2007/071556, filed Nov. 6, 2007, which claims the benefit of the priority of Japanese patent application No. 2006-305076 filed on Nov. 10, 2006, the disclosure of which is incorporated herein in its entirety by reference thereto.

TECHNICAL FIELD

The present invention relates to a test circuit, method, and semiconductor device.

BACKGROUND ART

As the scale and density of the chip increases due to the smaller size of semiconductor devices (the shrinking of transistor dimensions), so do the time required for performing selection tests (such as wafer test in the previous process and the final test after package process) and test cost, making the reduction of product costs difficult. The increase in the scale of the chip translates into a growing number of transistors per chip thereby increasing the number of combinations. The increase in the density of the chip translates into an increase in the number of transistors per unit area, thereby increasing the defect probability per unit area, complicating the physical phenomena, and increasing the number of types of defects. Further, due to higher integration and greater functionality, a longer period of time is required for the generation of a test pattern by for instance an ATPG (Automatic Test Pattern Generator).

As shown in FIG. 4, conventionally a technique that runs a test on a plurality of chips to be measured (a.k.a. DUT: Device Under Test) in parallel is used in order to reduce the test time. A plurality of input/output ports (pairs of drivers and comparators; a.k.a I/O channels or I/O pins) of a tester 1 (Automatic Test Equipment) are divided into a plurality of sections, a device to be measured is connected in each section, and the single tester 1 performs a parallel test on a plurality of chips to be measured 10-1 to 10-3 simultaneously. When functional testing is performed, a test pattern (force pattern) is supplied in parallel to the plurality of chips to be measured 10-1 to 10-3 from a separate driver (not shown in the drawing) of each section, outputs of the plurality of chips to be measured 10-1 to 10-3 are compared in parallel with an expectation value pattern by a comparator of each section, and then a result (pass or fail) is determined.

Further, regarding BOST (Built Out Self Test) used in the present invention, which will be described later, for instance Patent Document 1 can be referred to Patent Document 1 discloses a test apparatus that conducts a pattern dependency test and timing dependency test using semiconductor chips for testing such as BIST (Built In Self Test) and BOST. The invention disclosed in Patent Document 1 does not test chips to be measured and chips for testing in parallel.

[Patent Document 1]
Japanese Patent Kokai Publication No. JP-P2003-16799A

DISCLOSURE OF THE INVENTION

Problems to be Solved by the Invention

The entire disclosure of the above-mentioned Patent Document 1 is incorporated herein by reference thereto. The following analysis is given by the present invention.

In the configuration shown in FIG. 4, an increase in the number of the tests performed in parallel means an increase in the number of the input/output ports of the tester. Therefore, the number of the tests performed in parallel is limited by the number of the input/output ports of the tester.

Further, as semiconductor devices are equipped with greater functionality, it become more difficult and takes more time to create a test pattern. Particularly, it is essentially impossible to create a test pattern corresponding to the real-life operation conditions of semiconductor devices after shipment (after the devices have been mounted on clients' apparatuses) since specifications on the clients' side are unknown in most cases.

Therefore, it is an object of the present invention to provide a test circuit and method that perform a test on chips to be measured, simulating the actual operation using a chip mounted on an apparatus.

Further, it is another object of the present invention to provide a test circuit and method that facilitate parallel testing.

Means to Solve the Problems

In order to solve the above-mentioned problems, the configuration of the invention disclosed in the present application is summarized as follows.

A test circuit relating to an aspect of the present invention comprises means for applying a data pattern applied to a chip (may be termed "complete operating article chip", too) provided in a BOST (Built Out Self Test) to a chip to be measured, and means for comparing output data from the chip to be measured to output data from the chip in the BOST to determine whether or not they coincide.

In the present invention, there are provided a BOST (Built Out Self Test) having the chip mounted, first transfer circuits that receive a data pattern applied to the chip to be measured from a previous stage and that transfer the data pattern to a next stage, and second transfer circuits that receive an expectation value pattern for the chip to be measured from a previous stage and that transfer the expectation value pattern to a next stage; an output of the chip to be measured is compared to a corresponding expectation value pattern by a comparator provided corresponding to the chip to be measured; a pattern supplied to the chip in the BOST is used as the data pattern; and an output pattern from the chip in the BOST is used as the expectation value pattern.

In the present invention, the first transfer circuits successively transfer a data pattern applied to the chip in the BOST in response to a clock signal; the data pattern applied to the chip in the BOST is applied to one chip to be measured out of a plurality of chips to be measured; a data pattern from a corresponding stage of the first transfer circuits is applied to each of other chips to be measured; the second transfer circuits successively transfer output data from the chip in the BOST as an expectation value pattern in response to a clock signal; a comparator that compares output data from the one chip to be measured to the output data from the chip in the BOST to determine whether or not they coincide is provided; and a comparator, corresponding to each of the other chips to be measured, that compares output data of each of the other chips to be measured to an expectation value pattern from a corresponding stage of the second transfer circuits to determine whether or not they coincide is provided.

In the present invention, there is provided a clock distributing circuit that receives a clock signal supplied to the chip in the BOST and that supplies the clock signal to the plurality of chips to be measured, the first transfer circuits, and the second transfer circuits; and the timing relationship between a clock signal and a data pattern applied to a chip to be measured is unified between the plurality of chips to be measured.

In the present invention, the first transfer circuits are formulated by a plurality of cascade-connected flip-flops; the second transfer circuits are formulated by a plurality of cascade-connected flip-flops; a plurality of cascade-connected clock buffers that receive a clock signal from a clock supply source are provided; and a clock signal outputted from each stage of clock buffers is supplied to each of the plurality of chips to be measured and to a corresponding stage of flip-flops formulating the first transfer circuits and the second transfer circuits.

A test circuit relating to another aspect of the present invention tests a semiconductor device comprising a plurality of IP (Intellectual Property) cores. The test circuit comprises means for applying a data pattern applied to a one IP core to an IP core to be measured, and means for comparing output data from the one IP core to output data from the IP core to be measured to determine whether or not they coincide.

In the present invention, a test circuit tests a semiconductor device comprising a plurality of IP (Intellectual Property) cores. The test circuit comprises first transfer circuits that receive a data pattern applied to the IP core to be measured from a previous stage and that transfer the data pattern to a next stage, and second transfer circuits that receive an expectation value pattern for the IP core to be measured from a previous stage and that transfer the expectation value pattern to a next stage; an output of the IP core to be measured is compared to a corresponding expectation value pattern by a comparator provided corresponding to the IP core to be measured; a pattern supplied to a predetermined one IP core is used as the data pattern; and an output pattern from the one IP core is used as the expectation value pattern.

In the present invention, the first transfer circuits successively transfer a data pattern applied to the one IP core in response to a clock signal; the data pattern applied to the one IP core is applied to a one IP core to be measured out of a plurality of IP cores to be measured; a data pattern from a corresponding stage of the first transfer circuits is successively applied to each of other IP cores to be measured; the second transfer circuits successively transfer output data from the one IP core as an expectation value pattern in response to a clock signal; a comparator that compares output data from the one IP core to be measured to the output data from the one IP core to determine whether or not they coincide is provided; and a comparator, corresponding to each of the other IP cores to be measured, that compares output data of each of the other IP cores to be measured to an expectation value pattern from a corresponding stage of the second transfer circuits to determine whether or not they coincide is provided.

In the present invention, there is provided a clock distributing circuit that receives a clock signal supplied to the one IP core and that supplies the clock signal to the plurality of IP cores to be measured, the first transfer circuits, and the second transfer circuits; and the timing relationship between a clock signal and a data pattern applied to a IP core to be measured is unified between the plurality of IP cores to be measured.

In the present invention, the first transfer circuits are formulated by a plurality of cascade-connected flip-flops; the second transfer circuits are formulated by a plurality of cascade-connected flip-flops; a plurality of cascade-connected clock buffers that receive a clock signal supplied to the one IP core are provided; and a clock signal outputted from each stage of clock buffers is supplied to each of the plurality of IP cores to be measured and to a corresponding stage of flip-flops formulating the first transfer circuits and the second transfer circuits.

A method relating to yet another aspect of the present invention comprises: applying a data pattern applied to a chip provided in a BOST (Built Out Self Test) to a chip to be measured, and comparing output data from the chip to be measured to output data from the chip in the BOST to determine whether or not they coincide.

The present invention includes having first transfer circuits successively transfer a data pattern applied to the chip in the BOST in response to a clock signal; applying the data pattern supplied to the chip in the BOST to one chip to be measured out of a plurality of chips to be measured, and applying a data pattern from a corresponding stage of the first transfer circuits to each of other chips to be measured; having the second transfer circuits successively transfer the output data from the chip in the BOST as an expectation value pattern in response to a clock signal; and comparing output data from the one chip to be measured to the output data from the chip in the BOST to determine whether or not they coincide, and corresponding to each of the other chips to be measured, comparing output data of each of the other chips to be measured to an expectation value pattern from a corresponding stage of the second transfer circuits to determine whether or not they coincide.

A test method relating to yet another aspect of the present invention tests a semiconductor device comprising a plurality of IP (Intellectual Property) cores. The test method comprises: applying a data pattern applied to a one IP core to an IP core to be measured, and comparing output data from the one IP core to output data from the IP core to be measured to determine whether or not they coincide.

The test method of the present invention comprises: having first transfer circuits successively transfer a data pattern supplied to the one IP core in response to a clock signal; applying the data pattern supplied to the one IP core to a one IP core to be measured out of a plurality of IP cores to be measured, and successively applying a data pattern from a corresponding stage of the first transfer circuits to each of other IP cores to be measured; having the second transfer circuits successively transfer the output data from the one IP core as an expectation value pattern in response to a clock signal; and comparing output data from the one IP core to be measured to the output data from the one IP core to determine whether or not they coincide, and corresponding to each of the other IP cores to be measured, comparing output data of each of the other IP cores to be measured to an expectation value pattern from a corresponding stage of the second transfer circuits to determine whether or not they coincide.

Effects of the Invention

According to the present invention, functional testing can be performed in a state in which an apparatus with a chip mounted on is in actual operation. According to the present invention, it is not necessary to generate a test pattern. Further, according to the present invention, parallel testing is facilitated.

EXPLANATIONS OF SYMBOLS

Figure 1:
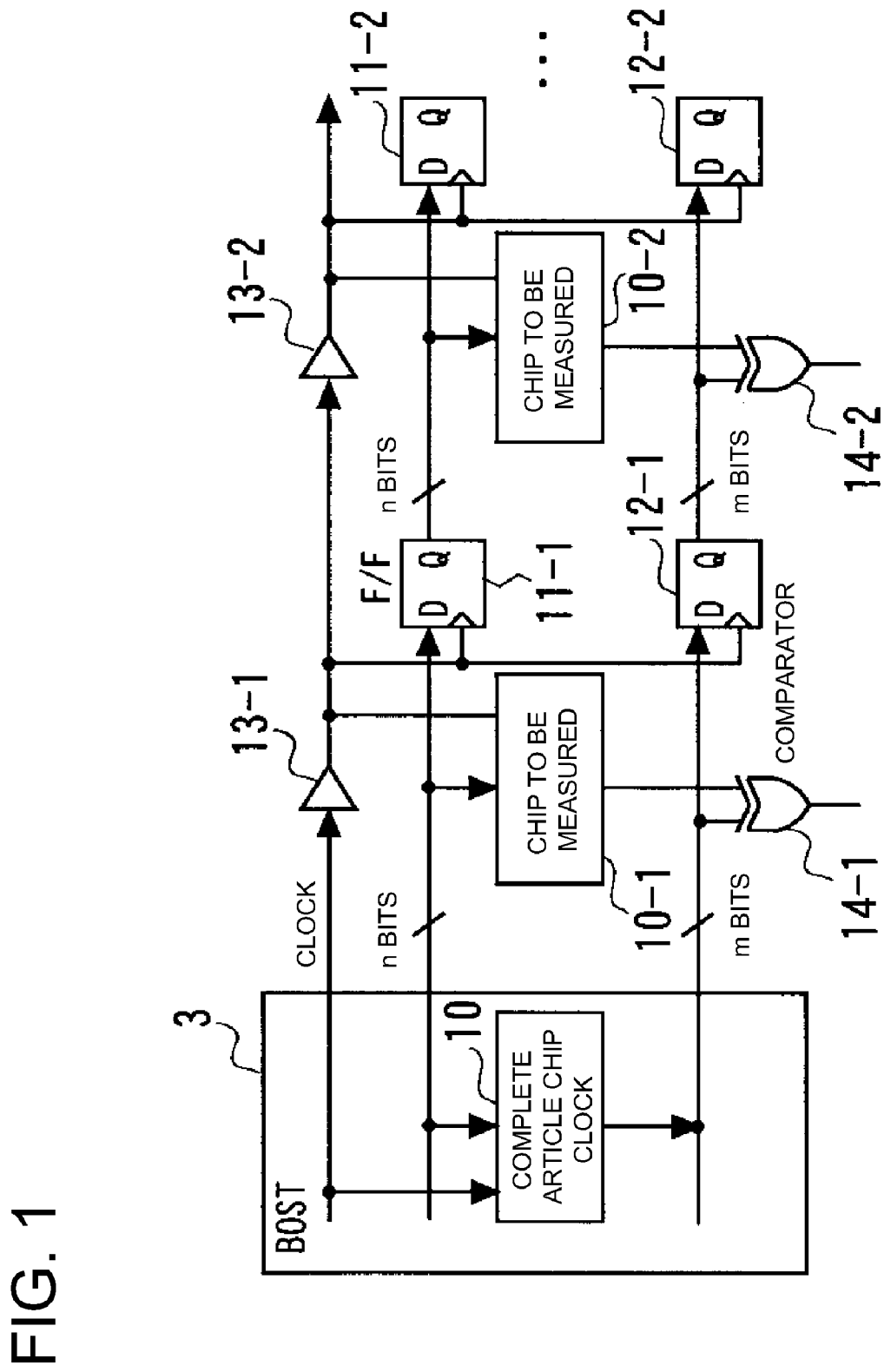
FIG. 1 is a drawing showing the configuration of a first exemplary embodiment of the present invention.

1: tester
2: chip
3: BOST
4: IP core
4-1, 4-2: IP core to be measured
5: basic operation portion
10: chip (complete operating article chip)
10-1, 10-2: chip to be measured
11-1, 11-2: F/F
12-1, 12-2: F/F
13-1, 13-2: clock buffer
14-1, 14-2: comparator (EXOR)

PREFERRED MODES FOR CARRYING OUT THE INVENTION

The present invention will be further described in detail with reference to the attached drawings. In a mode of the present invention, there are provided first transfer circuits (11-1, 11-2 . . . ) that extract a data pattern supplied to a complete operating article chip (10) in a BOST (3) from the BOST and that successively transmit the data pattern in response to a clock signal, and second transfer circuits (12-1, 12-2, . . . ) that extract output data of the complete operating article chip (10) from the BOST and that successively transmit the output data as an expectation value pattern in response to the clock signal. The data pattern applied to the complete operating article chip (10) is also applied to a (first) chip to be measured (10-1). The data pattern from a corresponding stage of the first transfer circuits (11-1, 11-2, . . . ) is applied to each of other chips to be measured (10-2, . . . ). There are also provided a comparator (14-1) that compares output data from the (first) chip to be measured (10-1) to the output data from the complete operating article chip (10) to decide whether or not they coincide, and a comparator (14-2, . . . ), corresponding to each of the other chips to be measured (10-2, . . . ), that compares respective output data from the other chips to be measured to the expectation value pattern from the corresponding stage of the second transfer circuits (12-1, 12-2, . . . ) to decide whether or not they coincide.

Further, in another mode of the present invention, a semiconductor device comprises a plurality of identical IP cores, first transfer circuits (11-1, 11-2, . . . ) that successively transmit a data pattern supplied to an IP core (4) in response to a clock signal, and second transfer circuits (12-1, 12-2, . . . ) that successively transmit output data of the IP core (4) as an expectation value pattern in response to the clock signal. The data pattern supplied to the IP core (4) is also applied to a one IP core to be measured (4-1). The data pattern from a corresponding stage of the first transfer circuits (11-1, 11-2 . . . ) is applied to each of other IP cores to be measured (4-2, . . . ), and there are also provided a comparator (14-1) that compares output data from the one IP core to be measured (4-1) to the output data from the IP core (4) to decide whether or not they coincide, and comparators (14-2, . . . ), corresponding to each of the other IP cores to be measured (4-2 . . . ), that compare respective output data from the other IP cores to be measured to the expectation value pattern from the corresponding stage of the second transfer circuits (12-1, 12-2, . . . ) to decide whether or not they coincide. The present invention will be further described using exemplary embodiments.

EXEMPLARY EMBODIMENTS

FIG. 1 is a drawing showing the configuration of a first exemplary embodiment of the present invention. In FIG. 1, a BOST (Built Out Self Test) 3 including the complete operating article chip 10 is provided. The BOST operates the chip 10 (called "complete operating article chip") mounted on the BOST device and performs testing according to the actual use conditions of the user.

A data signal (n-bit parallel data pattern) supplied to the complete operating article chip 10 of the BOST 3 is extracted from the BOST 3 and fed to an input terminal of the chip to be measured 10-1 and to a data input terminal D of a D-type flip-flop (abbreviated as F/F hereinafter) 11-1. Corresponding to the data signal having an n bit-width, the F/Fs 11-1 for n bits are provided and juxtaposed to each other (only one of them is shown in the drawing for the sake of simplicity). The F/F 11-1 samples the data signal at the data input terminal D on, for instance, the rising edge of the clock and outputs it from a data output terminal Q. It is also known as D-type register. The other F/Fs 11-2, . . . operate similarly.

The clock signal supplied to the complete operating article chip 10 of the BOST 3 is extracted from the BOST 3 and fed to an input terminal of a clock buffer 13-1. An output clock from the clock buffer 13-1 is fed to the chip to be measured 10-1 and to an input terminal of a clock buffer 13-2 in the next stage.

The output (m bit) of the complete operating article chip 10 of the BOST 3 is extracted from the BOST 3 and fed to a data input terminal D of a D-type flip-flop (abbreviated as F/F hereinafter) 12-1 and to an input terminal (m bit) of the comparator 14-1. The output (m bit) of the chip to be measured 10-1 is fed to the other input terminal (m bit) of the comparator 14-1. The comparator 14-1 compares the output (m bit) of the complete operating article chip 10 to the output data (m bit) of the chip to be measured 10-1 to determine whether or not they coincide.

The output clock from the clock buffer 13-1 is fed to a clock input terminal of the F/F 12-1. Further, the F/Fs 12-1 for m bits are provided and juxtaposed to each other (only one of them is shown in the figuring for the sake of simplicity). The F/F 12-1 samples the data signal at the data input terminal D on, for instance, the rising edge of the clock and outputs it from a data output terminal Q. It is also known as D-type register. The other F/Fs 12-2, . . . operate similarly.

The n-bit parallel data signal from the data output terminal Q of the F/F 11-1 is fed to an input terminal of the chip to be measured 10-2 and to a data input terminal D of the F/F 11-2 in the next stage.

An output clock from the clock buffer 13-2 is fed to the chip to be measured 10-2 and to an input terminal of a clock buffer in the next stage (not shown in the drawing).

An m-bit parallel expectation value from the data output terminal Q of the F/F 12-1 is fed to a data input terminal D of the F/F 12-2 in the next stage and to an input terminal (m bit) of the comparator 14-2, and an output (m bit) of the chip to be measured 10-2 is fed to the other input terminal (m bit) of the comparator 14-2. The comparator 14-2 compares the expectation value pattern (m bit) from the F/F 12-1 to the output data (m bit) of the chip to be measured 10-2 to determine whether or not they coincide. The comparators 14-1 and 14-2 may output a high level signal when the data do not coincide with each other, i.e., when even one bit of the two m-bit data does not coincide.

The output clock from the clock buffer 13-2 is fed to a clock input terminal of the F/F 12-2.

Further, while the comparators 14-1 and 14-2 are each represented by one EXOR circuit in FIG. 1, they comprise m number of EXOR circuits that compare each bit of the outputs (m bit) of the chips to be measured 10-1 and 10-2 to the corresponding bit of the expectation value patterns (m bit), and are formulated by OR circuits having ORs of the m EXOR circuits as their outputs. The comparator 14-2 is similarly formulated.

The n-bit parallel data signal from a data output terminal Q of the F/F 11-2 is fed to an input terminal of a chip to be measured (not shown in the figuring) in the next stage and to a data input terminal of a F/F (not shown in the figuring) in the next stage.

As described, in the present exemplary embodiment, the data pattern applied to the complete operating article chip 10 of the BOST 3 is used as the pattern (force pattern) applied to a plurality of chips to be measured and it is controlled so that the data pattern is successively transmitted to the input terminals of the chips to be measured for every clock cycle via the transfer circuits (the cascade-connected F/Fs 11-1, 11-2, ... ). Further, the expectation value pattern outputted from the complete operating article chip 10 of the BOST 3 is successively transmitted via the transfer circuits (the cascade-connected F/Fs 12-1, 12-2, ... ) and in each stage of the transfer circuits, the expectation value pattern is supplied to the comparator as the expectation value pattern for the chip to be measured corresponding to that particular stage.

The comparators 14-1, 14-2, ... are able to detect whether the chips to be measured have passed or failed.

Figure 2A:
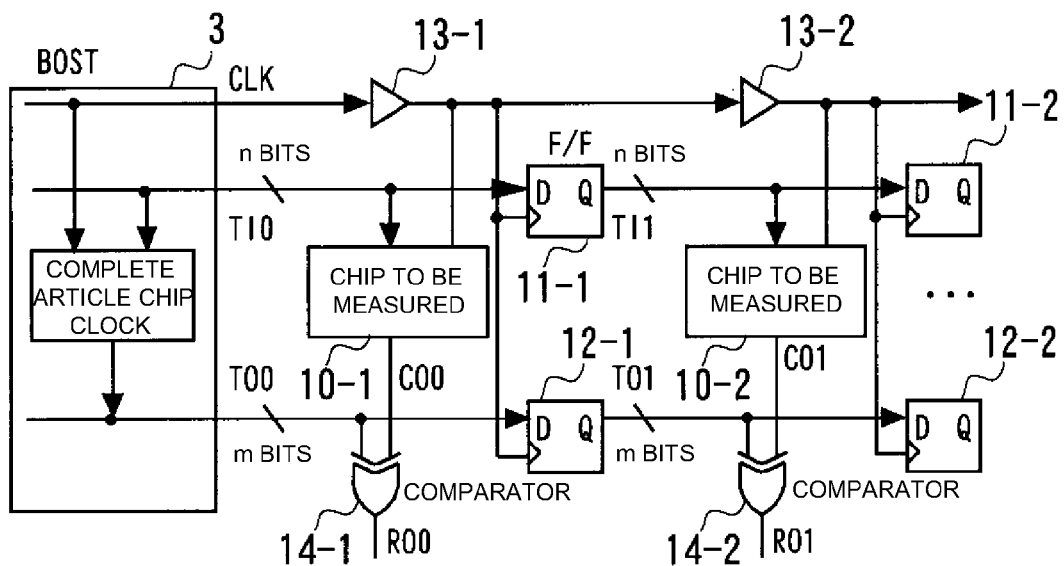
FIGS. 2A and 2B are drawings for explaining the first exemplary embodiment of the present invention.
Figure 2B:
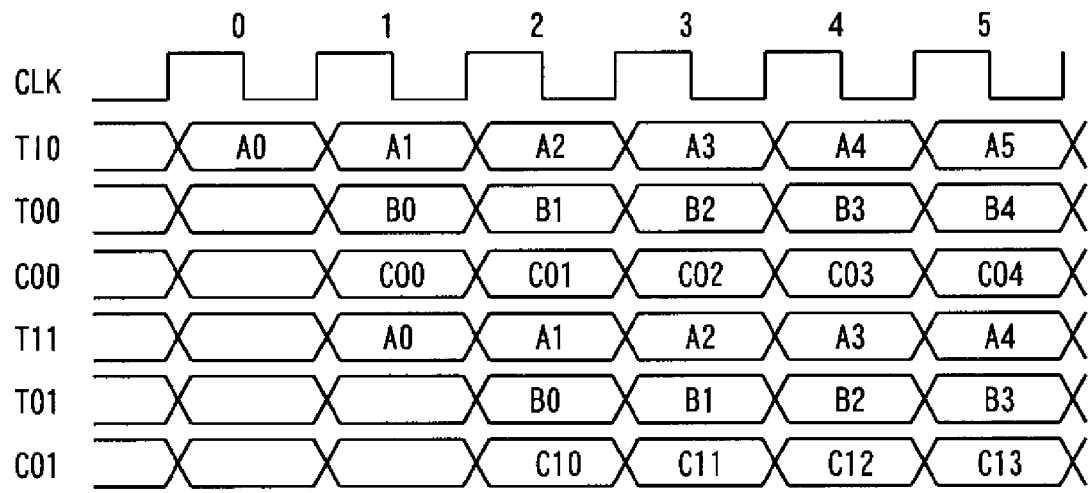

FIGS. 2A and 2B are drawings for explaining the operation of the present exemplary embodiment. In FIG. 2A, signal names are added to the circuit configuration shown in FIG. 1. FIG. 2B is a timing chart showing an example of the operation waveforms of the signals in FIG. 2A.

CLK is the clock signal extracted from the BOST 3 and supplied to the complete operating article chip 10 in the BOST 3.

TI0 is an output (n-bit data pattern) of the BOST 3 and is the data pattern supplied to the complete operating article chip 10. TI0 is outputted as A0, A1, A2, A3, A4, A5, ... in clock cycles 0, 1, 2, 3, 4, 5

TO0 is an output (m-bit expectation value pattern) of the BOST 3. TO0 is outputted as B0, B1, B2, B3, B4, ... in clock cycles 1, 2, 3, 4, 5, ... .

CO0 is the output (m bit) of the chip to be measured 10-1. CO0 is outputted as C00, C01, C02, C03, C04, ... in clock cycles 1, 2, 3, 4, 5, TI1 is the output (n bit) of the F/F 11-1 and is outputted as A0, A1, A2, A3, A4, ... in clock cycles 1, 2, 3, 4, 5, ... one cycle behind TI0.

TO1 is the output (m bit) of the F/F 12-1. It is outputted as B0, B1, B2, B3, ... in clock cycles 2, 3, 4, 5 ... .

CO1 is the output (m bit) of the chip to be measured 10-2. It is outputted as C10, C11, C12, C13, ... in clock cycles 2, 3, 4, 5, ... .

A0 is fed to the chip to be measured 10-1 from the BOST 3 in clock cycle 0, and C00 is outputted from the chip to be measured 10-1 in the next clock cycle 1. In clock cycle 1, the output data C00 of the chip to be measured 10-1 is compared to the expectation value B0 from the BOST 3, and a comparison result R00 is outputted. Further, in clock cycle 1, A1 is fed to the chip to be measured 10-1 from the BOST 3 and the output A0 from the F/F 11-1 is fed to the chip to be measured 10-2.

In the next clock cycle 2, the output C01 is outputted from the chip to be measured 10-1 as a response to A1 and compared to the expectation value B1 from the BOST 3 by the comparator 14-1. Further, A2 is fed to the chip to be measured 10-1 from the BOST 3, and the output A1 from the F/F 11-1 is fed to the chip to be measured 10-2. From the chip to be measured 10-2, the output C10 is outputted as a response to A0, and C10 is compared to the expectation value B0 outputted from the F/F 12-1 by the comparator 14-2. Then, data patterns and expectation value patterns are similarly supplied from the BOST 3 thereafter, and each of the comparators 14-1, 14-2, ... determines pass or fail.

According to the present exemplary embodiment, a plurality of chips to be measured can be tested in parallel using a single BOST. Further, according to the present exemplary embodiment, since there is provided a clock distributing circuit comprising the clock buffers (13-1, 13-2, ... ) that supply clock to the chips to be measured, the data transfer circuits (11-1, 11-2, ... ), and the circuits that transfer the expectation value pattern (12-1, 12-2, ... ), the timing phase between the clock signal for each chip to be measured and the data pattern applied to it is nearly equal between the complete operating article chip 10 and the plurality of the chips to be measured 10-1, 10-2, ... . In other words, the clock distributing circuit prevents the waveform blunting of the clock, making a functional test using a high test frequency possible. This is one of the characteristics of the present invention.

Further, according to the present exemplary embodiment, one single BOST can test a plurality of chips.

In the present exemplary embodiment, the chips to be measured may be tested using a BT (Burn-in Test) device. In this case, the chips to be measured 10-1, 10-2, ... , the F/Fs 11-1, 11-2, ... , the F/Fs 12-1, 12-2, ... , the clock buffers 13-1, 13-2, ... , and the comparator 14-1, 14-2, ... are mounted on a burn-in board (not shown in the figuring). The outputs of the comparators 14-1, 14-2, ... may be fed to a burn-in tester (not shown in the figuring).

According to the present exemplary embodiment, it is possible to test the chips to be measured 10-1, 10-2, ... by simply supplying power to the BOST 3 and operating the complete operating article chip 10.

Further, pass/fail results may be indicated by a LED (not shown in the drawing), which lights up when the outputs of the comparators 14-1, 14-2, ... indicate "fail," provided on a test board (not shown in the drawing), on which the chips to be measured 10-1, 10-2, ... are mounted.

Or it may be configured so that the BOST 3 is controlled using the power supply for a tester (not shown in the drawing) and its input/output ports (channels), and the comparison results of the comparators 14-1, 14-2, ... are fed to the tester (not shown in the drawing). Or as a variation, the data pattern may be applied to the complete operating article chip 10 from the tester (not shown in the drawing).

Figure 3A:
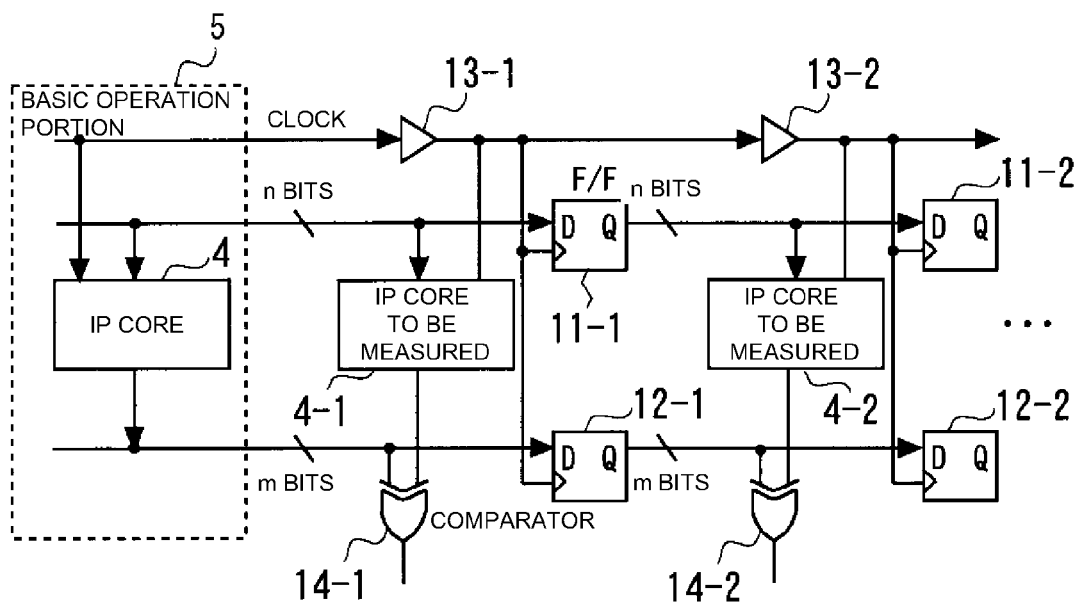
FIGS. 3A and 3B are drawings showing the configuration of a second exemplary embodiment of the present invention.
Figure 3B:
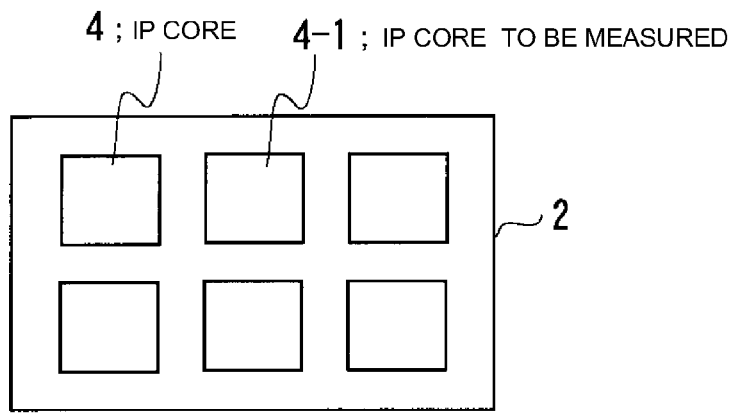

Next, a second exemplary embodiment of the present invention will be described. FIGS. 3A and 3B are drawings showing the configuration of the second exemplary embodiment of the present invention. In a case where a plurality of IPs (Intellectual Property) configured identically are included in a semiconductor device (chip) 2 as shown in FIG. 3B, a failure can be detected by comparing test results of the IP core 4 and the IP core to be measured 4-1.

As shown in FIG. 3A, in the present exemplary embodiment, the IP core 4 is incorporated into the configuration of the test circuit shown in FIG. 1 and described in the first exemplary embodiment, and the chips to be measured in FIG. 1 are replaced by the IP cores to be measured in the present exemplary embodiment. A data pattern (n bit) fed to the IP core 4 in a basic operation portion 5 is also applied to the IP core 4-1, and quality assessment is performed by having the comparator 14-1 compare each output (m bit). The data pattern applied to the IC core 4-1 is sampled by the F/F 11-1 in synchronization with the rising edge of the clock buffer 13-1 and outputted from the data output terminal Q. As a result, a data pattern identical to the data pattern applied to the IP core 4-1 is applied to the IP core 4-2 by the F/F 11-1 one clock cycle later, and quality assessment is performed by having the comparator 14-2 compare the output pattern of the IP core 4-2 to the pattern outputted from the F/F 12-1, which has sampled the output of the IP core 4. The outputs of the comparators 14-1, 14-2, . . . may be outputted externally without any change, or they may be compressed to 1 bit and outputted externally as pass/fail information.

The data pattern fed to the IP core 4 may be applied to the IP core 4-1 when the semiconductor device 2 is powered on and operated.

Or the data pattern may be supplied the IP core 4 of the basic operation portion 5 from the outside, having the comparison results of the comparators 14-1 and 14-2 fed to a tester (not shown in the drawing).

Figure 4:
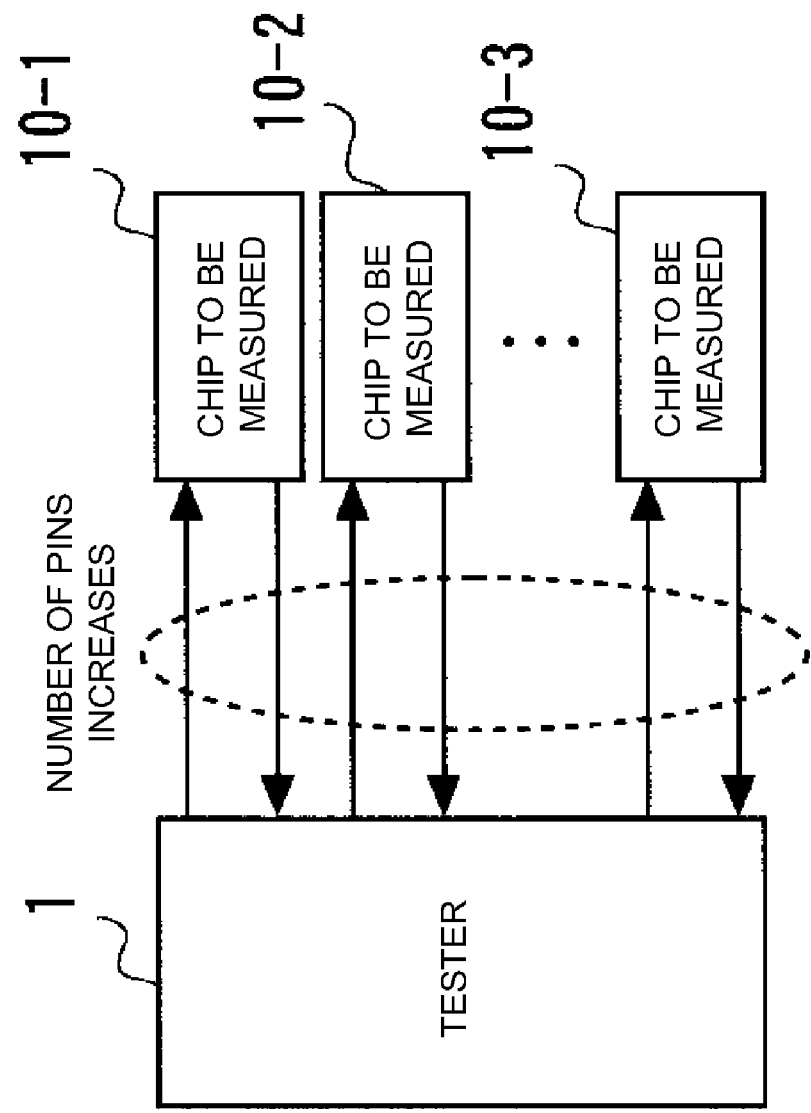
FIG. 4 is a drawing for explaining parallel testing.

For a semiconductor device comprising a plurality of IP cores configured identically as the one shown in FIG. 3B, when the plurality of IP cores are tested in parallel in the form shown in FIG. 4 (note: the chips to be measured in FIG. 4 are replaced by the IP cores), sometimes it is impossible to test all the IP cores in parallel because of the limitation on the number of the input/output ports (channel) of the tester. In this case, normally the plurality of IP cores are grouped into a predetermined number of IP cores, and the parallel test is performed for each group. For instance, if six IP cores in the chip (semiconductor device) 2 are divided into three groups (two per group) and the parallel test is performed for each of the three groups, the test time will be three times as long as when the six IP cores are tested in parallel. Therefore, the test time will increase greatly.

On the other hand, according to the present exemplary embodiment, the tester can perform parallel testing on a plurality of IP cores, only needing input/output ports of a number corresponding to that of pins of one IP core, therefore it is possible to reduce the test time while suppressing an increase in required tester resources, and its practical value is very high.

It should be noted that other objects, features and aspects of the present invention will become apparent in the entire disclosure and that modifications may be done without departing the gist and scope of the present invention as disclosed herein and claimed as appended herewith.

Also it should be noted that any combination of the disclosed and/or claimed elements, matters and/or items may fall under the modifications aforementioned.

What is claimed is:

1. A test circuit that applies a data pattern applied to a chip provided in a BOST (Built Out Self Test) to a planarity of chips to be measured and compares output data from said chips to be measured to output data from said chip in said BOST to determine whether or not they coincide, said test circuit comprising:
a BOST having said chip mounted;
first transfer circuits that receive a data pattern applied to said chip to be measured from a previous stage and that transfer said data pattern to a next stage; and
second transfer circuits that receive an expectation value pattern for said chip to be measured from a previous stage and that transfer said expectation value pattern to a next stage, wherein
an output of said chip to be measured is compared to a corresponding expectation value pattern by a comparator provided corresponding to said chip to be measured;
a pattern supplied to said chip in said BOST is used as said data pattern; and
an output pattern from said chip in said BOST is used as said expectation value pattern,
said first transfer circuits successively transferring a data pattern applied to said chip in said BOST in response to a clock signal,
said data pattern applied to said chip in said BOST being applied to one chip to be measured out of said plurality of chips to be measured and a data pattern from a corresponding stage of said first transfer circuits being applied to each of other chips to be measured,
said second transfer circuits successively transferring output data from said chip in said BOST as said expectation value pattern in response to a clock signal, said test circuit further comprising:
one comparator comparing output data from said one chip to be measured to said output data from said chip in said BOST to determine whether or not they coincide is provided;
other comparators, each corresponding to each of said other chips to be measured, that compares output data of each of said other chips to be measured to an expectation value pattern from a corresponding stage of said second transfer circuits to determine whether or not they coincide is provided; and
a clock distributing circuit that receives a clock signal supplied to said chip in said BOST and that supplies said clock signal to said plurality of chips to be measured, said first transfer circuits, and said second transfer circuits; wherein timing relationship between a clock signal and a data pattern applied to a chip to be measured is unified between said plurality of chips to be measured.

2. A test circuit that applies a data pattern applied to a chip provided in a BOST (Built Out Self Test) to a planarity of chips to be measured and compares output data from said chips to be measured to output data from said chip in said BOST to determine whether or not they coincide, said test circuit comprising:
a BOST having said chip mounted;
first transfer circuits that receive a data pattern applied to said chip to be measured from a previous stage and that transfer said data pattern to a next stage; and
second transfer circuits that receive an expectation value pattern for said chip to be measured from a previous stage and that transfer said expectation value pattern to a next stage, wherein
an output of said chip to be measured is compared to a corresponding expectation value pattern by a comparator provided corresponding to said chip to be measured;
a pattern supplied to said chip in said BOST is used as said data pattern; and
an output pattern from said chip in said BOST is used as said expectation value pattern,
said first transfer circuits successively transferring a data pattern applied to said chip in said BOST in response to a clock signal,
said data pattern applied to said chip in said BOST being applied to one chip to be measured out of said plurality of chips to be measured and a data pattern from a corresponding stage of said first transfer circuits being applied to each of other chips to be measured,
said second transfer circuits successively transferring output data from said chip in said BOST as said expectation value pattern in response to a clock signal, said test circuit further comprising:
one comparator comparing output data from said one chip to be measured to said output data from said chip in said BOST to determine whether or not they coincide is provided and other comparators, each corresponding to each of said other chips to be measured, that compares output data of each of said other chips to be measured to an expectation value pattern from a corresponding stage of said second transfer circuits to determine whether or not they coincide is provided, wherein said first transfer circuits are formulated by a plurality of cascade-connected flip-flops;

said second transfer circuits are formulated by a plurality of cascade-connected flip-flops;

a plurality of cascade-connected clock buffers that receive a clock signal from a clock supply source are provided; and a clock signal outputted from each stage of clock buffers is supplied to each of said plurality of chips to be measured and to a corresponding stage of flip-flops formulating said first transfer circuits and said second transfer circuits.

3. A test circuit that tests a semiconductor device comprising a plurality of IP (Intellectual Property) cores, and that applies a data pattern applied to one IP core to an IP core to be measured; and compares output data from said one IP core to output data from said IP core to be measured to determine whether or not they coincide, said test circuit comprising:

first transfer circuits that receive a data pattern applied to said IP core to be measured from a previous stage and that transfer said data pattern to a next stage; and second transfer circuits that receive an expectation value pattern for said IP core to be measured from a previous stage and that transfer said expectation value pattern to a next stage; wherein an output of said IP core to be measured is compared to a corresponding expectation value pattern by a comparator provided corresponding to said IP core to be measured;

a pattern supplied to a predetermined one IP core is used as said data pattern; and an output pattern from said one IP core is used as said expectation value pattern, said first transfer circuits successively transferring a data pattern applied to said one IP core in response to a clock signal, said data pattern applied to said one IP core being applied to a one IP core to be measured out of a plurality of IP cores to be measured, and a data pattern from a corresponding stage of said first transfer circuits being successively applied to each of other IP cores to be measured, said second transfer circuits successively transferring output data from said one IP core as an expectation value pattern in response to a clock signal, said test circuit further comprising:

one comparator that compares output data from said one IP core to be measured to said output data from said one IP core to determine whether or not they coincide is provided;

other comparators, each corresponding to each of said other IP cores to be measured, that compares output data of each of said other IP cores to be measured to an expectation value pattern from a corresponding stage of said second transfer circuits to determine whether or not they coincide is provided; and a clock distributing circuit that receives a clock signal supplied to said one IP core and that supplies said clock signal to said plurality of IP cores to be measured, said first transfer circuits, and said second transfer circuits; wherein timing relationship between a clock signal and a data pattern applied to an IP core to be measured is unified between said plurality of IP cores to be measured.

4. A test circuit that tests a semiconductor device comprising a plurality of IP (Intellectual Property) cores, and that applies a data pattern applied to one IP core to an IP core to be measured; and compares output data from said one IP core to output data from said IP core to be measured to determine whether or not they coincide, said test circuit comprising:

first transfer circuits that receive a data pattern applied to said IP core to be measured from a previous stage and that transfer said data pattern to a next stage; and second transfer circuits that receive an expectation value pattern for said IP core to be measured from a previous stage and that transfer said expectation value pattern to a next stage; wherein an output of said IP core to be measured is compared to a corresponding expectation value pattern by a comparator provided corresponding to said IP core to be measured;

a pattern supplied to a predetermined one IP core is used as said data pattern; and an output pattern from said one IP core is used as said expectation value pattern, said first transfer circuits successively transferring a data pattern applied to said one IP core in response to a clock signal, said data pattern applied to said one IP core being applied to a one IP core to be measured out of a plurality of IP cores to be measured, and a data pattern from a corresponding said first transfer circuits being successively applied to each of other IP cores to be measured, said second transfer circuits successively transferring output data from said one IP core as an expectation value pattern in response to a clock signal, said test circuit further comprising:

one comparator that compares output data from said one IP core to be measured to said output data from said one IP core to determine whether or not they coincide is provided; and other comparators, each corresponding to each of said other IP cores to be measured, that compares output data of each of said other IP cores to be measured to an expectation value pattern from a corresponding stage of said second transfer circuits to determine whether or not they coincide is provided, wherein said first transfer circuits are formulated by a plurality of cascade-connected flip-flops;

said second transfer circuits are formulated by a plurality of cascade-connected flip-flops;

a plurality of cascade-connected clock buffers that receive a clock signal supplied to said one IP core are provided; and a clock signal outputted from each stage of clock buffers is supplied to each of said plurality of IP cores to be measured and to a corresponding stage of flip-flops formulating said first transfer circuits and said second transfer circuits.

5. A semiconductor device comprising the test circuit as defined in claim 1.

6. A test circuit comprising:

N number of chips under test, where N is a preset integer not less than 2;

a BOST including a chip, said chip and said N number of chips under test having said same configuration;

(N−1) stages of first registers;

(N−1) stages of second registers;

N stages of clock buffers; and
N stage of comparators,
a first stage first register receiving a data pattern applied to said chip in said BOST and being output from said BOST, and responsive to a clock signal output from a first stage clock buffer, capturing and outputting said received data pattern, other stages of said first registers following said first stage first register, each receiving a data pattern output from a preceding stage first register and responsive to a clock signal output from a corresponding stage clock buffer, capturing and outputting said received data pattern,
a first chip under test, receiving a data pattern from said BOST, said data pattern being applied to said chip in said BOST, said first chip under test being driven by a clock signal output from said first stage clock buffer, other chips under test each receiving a data pattern output from a preceding stage first register and each being driven by a clock signal output from a corresponding stage clock buffer,
said first stage second register receiving an output from said chip in said BOST and responsive to said clock signal output from said first stage clock buffer, capturing and outputting said received output as an expected pattern, other stages of second registers following said first stage second register, each receiving an output from a preceding stage second register and responsive to a clock signal output from a corresponding stage clock buffer, capturing and outputting said received output as an expected pattern,
a first stage comparator receiving an output from a first stage chip under test and said output from said chip in said BOST for comparison to determine coincidence or non-coincidence therebetween, other stages of said comparators, each receiving an output from a corresponding chip under test and an output from a preceding stage second register as an output, for comparison to determine coincidence or non-coincidence therebetween.

* * * * *